United States Patent
Hagihara

(10) Patent No.: US 8,513,818 B2
(45) Date of Patent: Aug. 20, 2013

(54) SEMICONDUCTOR DEVICE AND METHOD FOR FABRICATING THE SAME

(75) Inventor: Kiyomi Hagihara, Osaka (JP)

(73) Assignee: Panasonic Corporation, Osaka (JP)

( * ) Notice: Subject to any disclaimer, the term of this patent is extended or adjusted under 35 U.S.C. 154(b) by 309 days.

(21) Appl. No.: 13/038,950

(22) Filed: Mar. 2, 2011

(65) Prior Publication Data

US 2011/0147927 A1 Jun. 23, 2011

Related U.S. Application Data

(63) Continuation of application No. PCT/JP2009/005495, filed on Oct. 20, 2009.

(30) Foreign Application Priority Data

Jan. 7, 2009 (JP) .................................. 2009-001444

(51) Int. Cl.
*H01L 23/52* (2006.01)
*H01L 23/48* (2006.01)
*H01L 29/40* (2006.01)

(52) U.S. Cl.
USPC ................... 257/781; 257/E23.021; 257/778; 257/780; 257/786; 438/108; 438/614

(58) Field of Classification Search
USPC .......... 257/E23.021, E21.499, 737, 778–781, 257/786; 438/108, 118, 612, 614, 666
See application file for complete search history.

(56) References Cited

U.S. PATENT DOCUMENTS

| | | | |
|---|---|---|---|
| 6,013,571 A * | 1/2000 | Morrell ......................... | 438/612 |
| 6,762,506 B2 * | 7/2004 | Amagai et al. ................ | 257/786 |
| 6,784,554 B2 * | 8/2004 | Kajiwara et al. .............. | 257/778 |
| 6,838,762 B2 * | 1/2005 | Tao et al. ....................... | 257/690 |
| 6,879,041 B2 | 4/2005 | Yamamoto et al. | |
| 7,122,460 B2 * | 10/2006 | Hua .............................. | 438/614 |
| 7,319,276 B2 * | 1/2008 | Hsu et al. ...................... | 257/780 |
| 7,411,303 B2 * | 8/2008 | Abbott .......................... | 257/762 |
| 7,749,888 B2 * | 7/2010 | Nishiyama et al. ........... | 438/612 |
| 7,812,460 B2 * | 10/2010 | Hsu ............................... | 257/778 |
| 7,906,377 B2 * | 3/2011 | Chang et al. .................. | 438/124 |
| 8,232,643 B2 * | 7/2012 | Chuang et al. ................ | 257/738 |

(Continued)

FOREIGN PATENT DOCUMENTS

| | | |
|---|---|---|
| JP | 2003-309223 | 10/2003 |
| JP | 2006-049675 | 2/2006 |
| JP | 2007-242782 | 9/2007 |
| WO | WO 2006/046510 A1 | 5/2006 |

*Primary Examiner* — Chris Chu

(74) *Attorney, Agent, or Firm* — McDermott Will & Emery LLP

(57) ABSTRACT

A semiconductor device includes a semiconductor chip having an element formation surface on which at least one element is formed and including a plurality of electrode pads formed on the element formation surface, an interconnect substrate having a principal surface facing the element formation surface of the semiconductor chip and including a plurality of connection pads formed at positions of the principal surface facing the respective corresponding electrode pads, and a plurality of solder bumps provided between the respective corresponding electrode pads and connection pads, and configured to electrically connect the respective corresponding electrode pads and connection pads together. An UBM layer is formed on a portion of each solder bump closer to the corresponding electrode pad and a barrier metal layer is formed on a portion of each solder bump closer to the corresponding connection pad, and the two layers have substantially the same composition of major materials.

14 Claims, 10 Drawing Sheets

(56) References Cited

U.S. PATENT DOCUMENTS

| | | | |
|---|---|---|---|
| 8,242,011 B2 * | 8/2012 | Lim et al. | 438/613 |
| 8,324,740 B2 * | 12/2012 | Hagihara | 257/786 |
| 8,330,272 B2 * | 12/2012 | Haba | 257/737 |
| 8,338,287 B2 * | 12/2012 | Miura et al. | 438/614 |
| 8,344,269 B2 * | 1/2013 | Fukuda | 174/538 |
| 8,357,860 B2 * | 1/2013 | Kaneko | 174/262 |
| 2003/0197277 A1 * | 10/2003 | Yamamoto et al. | 257/772 |
| 2004/0175917 A1 | 9/2004 | Maeda et al. | |
| 2005/0224966 A1 | 10/2005 | Fogel et al. | |
| 2008/0202792 A1 | 8/2008 | Fogel et al. | |
| 2008/0203585 A1 | 8/2008 | Fogel et al. | |
| 2008/0206979 A1 | 8/2008 | Fogel et al. | |

* cited by examiner

SEMICONDUCTOR DEVICE AND METHOD FOR FABRICATING THE SAME

CROSS-REFERENCE TO RELATED APPLICATIONS

This is a continuation of PCT International Application PCT/JP2009/005495 filed on Oct. 20, 2009, which claims priority to Japanese Patent Application No. 2009-001444 filed on Jan. 7, 2009. The disclosures of these applications including the specifications, the drawings, and the claims are hereby incorporated by reference in their entirety.

BACKGROUND

The present disclosure relates to semiconductor devices and methods for fabricating the semiconductor devices, and more particularly, to semiconductor devices which are formed by flip chip mounting with solder bumps and methods for fabricating the semiconductor devices.

In recent years, there has been an increasing demand for higher-performance and smaller-size electronic apparatuses, in which electronic parts need to be integrated and mounted with higher density. Semiconductor devices (semiconductor packages) used in such electronic apparatuses have had an increasingly smaller size and larger number of pins.

Conventional packages having a lead frame have reached the limit of their size reduction. Therefore, in order to increase the integration and mounting densities of a semiconductor device, wire bonding, tape automated bonding (TAB), or flip chip has been used for fabrication of the semiconductor device. Of these mounting techniques, flip chip can provide the highest density of a semiconductor device while reducing the size of the semiconductor device, and therefore, is frequently used for semiconductor devices for computer apparatuses, high-performance mobile apparatuses, etc.

Flip chip is a surface mounting technique which can provide a large number of electrical connections in a small area, but leads to a narrower pitch of connection pads as the size of a semiconductor device decreases and the number of pins in the semiconductor device increases. As the connection pad pitch is narrowed, the height of solder bumps tends to decrease. It is expected that, in the future, semiconductor devices having such a narrower connection pad pitch (particularly, 200 µm or less) will become a mainstream.

In a typical flip chip mounting, solder bumps are formed on electrode pads provided on a semiconductor chip with an under bump metal (UBM) layer being interposed as a barrier layer therebetween in order to reduce or prevent an intermetallic compound which would otherwise be formed of copper, aluminum or an alloy thereof contained in the electrode pad and tin contained in the solder bump.

Also, on the connection pad provided on an interconnect substrate on which the semiconductor chip is mounted, a barrier metal layer made of a metal, such as nickel (Ni), titanium (Ti), etc., or an alloy thereof is formed in order to reduce or prevent an alloy layer which would otherwise be formed of tin contained in the solder bump and copper contained in the connection pad, thereby improving the reliability of connection. Note that, in general, as the barrier metal layer, an electroless nickel film which is formed by electroless nickel plating is used from the standpoint of manufacturing cost and workability.

The semiconductor chip and the interconnect substrate have significantly different coefficients of thermal expansion. Therefore, if there is a large change in temperature of the semiconductor chip and the interconnect substrate during a flip chip mounting process etc., stress is concentrated and applied to portions of the solder bump which bonds the semiconductor chip to the interconnect substrate. In this case, a crack is likely to occur in the bonding portions or in the vicinity thereof, resulting in a faulty connection.

Therefore, in order to ensure the reliability of connection, the bonding portions of the solder bumps may be encapsulated by filling a gap between the semiconductor chip and the interconnect substrate with an insulating resin material called "underfill" and curing the material after flip chip mounting. In this case, however, as described above, in a semiconductor device which has a smaller size and a larger number of pins, the solder bump also has a smaller size, and therefore, stress applied to the bonding portion of the solder bump increases. Therefore, the protection by encapsulation of the bonding portion using the underfill resin material is unlikely to be sufficient for prevention of occurrence of a crack.

Various measures have been taken for the above problem. For example, Japanese Patent Publication No. 2007-242782 describes the following technique. In a semiconductor device in which solder bumps serving as electrodes for external connection are joined to a semiconductor substrate, a simple structure is provided which does not accompany an increase in thickness, and the volumes of solder bumps located on the four corner portions of the semiconductor chip to which stress is particularly concentrated and applied to are increased compared to the other solder bumps, whereby the cross-sectional areas of the solder bumps on the corner portions are increased.

Thus, in the semiconductor device described in Japanese Patent Publication No. 2007-242782, in order to improve the life of connection in a state in which the semiconductor chip is mounted on the interconnect substrate, the opening diameters of only electrode pads on the four corner portions of the semiconductor chip are increased compared to the other electrode pads formed on the semiconductor chip. As a result, solder bumps which are formed on the four corner portions of the semiconductor chip are larger than the other solder bumps, and the bonding portions of the solder bumps having the larger diameter can reduce or absorb stress.

SUMMARY

In the above conventional semiconductor device, however, Japanese Patent Publication No. 2007-242782 describes no measures that should be taken in order to prevent destruction of the solder bump which is likely to occur due to the influence of stress applied to the solder bump which is caused by the difference in internal stress between the electrode pad of the semiconductor chip and the connection pad of the interconnect substrate and which is increased by the increase of the size of the electrode pad, or due to an imbalance of stress.

Also, in the above conventional semiconductor device, the volume of a solder bump formed on the semiconductor chip varies depending on the position on the semiconductor chip. Therefore, a void occurs in a solder bump when solder bumps are formed using the paste printing technique or the paste dispensing technique, resulting in an increase in resistance or a faulty connection. The method of forming solder bumps is limited, and therefore, it is difficult to provide narrow-pitch connection.

Solder electroplating is a mainstream technique of forming solder bumps because the process is easily performed.

There is another technique of forming UBM and solder bumps without using exposure, development, or electroplating. Specifically, UBM may be selectively formed on electrode pads on a semiconductor chip using electroless nickel plating, and thereafter, solder balls are formed at desired positions and then subjected to a reflow process, thereby forming solder bumps (ball mounting). Alternatively, solder bumps may be formed by printing solder paste at desired positions using a mask (e.g., solder paste printing etc.).

In the solder paste printing technique, however, when the solder bump pitch is 200 μm or less, a short circuit occurs between adjacent bumps during solder printing, resulting in a considerable decrease in yield. Therefore, the solder ball mounting technique is preferably used for formation of solder bumps having a narrow pitch.

The solder ball mounting technique is preferable as a technique of forming solder bumps on electrode pads on which UBM has been formed by electroless plating, but because solder balls having the same dimension are simultaneously mounted, the dimension and composition of the solder bumps formed on the same plane cannot be changed. Therefore, as is different from Japanese Patent Publication No. 2007-242782, it is not possible to change the shape (volume) of a solder bump, depending on the position on a semiconductor chip, to reduce stress applied to the bonding portion. Therefore, the solder ball mounting technique has a problem that the connection reliability after mounting is lower.

The present disclosure describes implementations of a semiconductor device in which a semiconductor chip can be mounted with high connection reliability without limiting the method of forming solder bumps on the semiconductor chip and while causing a plurality of bonding portions of the solder bumps to have substantially the same area.

According to the present disclosure, in the semiconductor device, substantially the same composition is provided on a portion of the solder bump closer to the semiconductor chip and on a portion of the solder bump closer to the interconnect substrate.

An example semiconductor device includes a semiconductor chip having an element formation surface on which at least one element is formed and including a plurality of electrode pads formed on the element formation surface, an interconnect substrate having a principal surface facing the element formation surface of the semiconductor chip and including a plurality of connection pads formed at positions of the principal surface facing the respective corresponding electrode pads, and a plurality of solder bumps provided between the respective corresponding electrode pads and connection pads, and configured to electrically connect the respective corresponding electrode pads and connection pads together. A first layer is formed on a portion of each of the solder bumps closer to the corresponding electrode pad and a second layer is formed on a portion of each of the solder bumps closer to the corresponding connection pad, and the first and second layers have substantially the same composition of major materials.

According to the example semiconductor device, for each of the solder bumps electrically connecting the electrode pads of the semiconductor chip and the connection pads of the interconnect substrate together, the first layer formed on the portion of the solder bump closer to the electrode pad and the second layer formed on the portion the solder bump closer to the connection pad have substantially the same composition of major materials. Therefore, the semiconductor chip and the interconnect substrate apply substantially equal thermal stress to the solder bump, and therefore, a crack is more unlikely to occur in the solder bump.

In the example semiconductor device, the first layer formed on the portion of the solder bump closer to the electrode pad and the second layer formed on the portion of the solder bump closer to the connection pad may both be amorphous.

In this case, a barrier layer made of a nickel compound is preferably formed by electroless plating between the solder bump and the electrode pad and between the solder bump and the connection pad.

In the example semiconductor device, the first layer formed on the portion of the solder bump closer to the electrode pad and the second layer formed on the portion of the solder bump closer to the connection pad may both be crystalline.

In this case, a barrier layer made of a nickel compound is preferably formed by electroplating between the solder bump and the electrode pad and between the solder bump and the connection pad.

In the example semiconductor device, when any of the above barrier layers is provided, the barrier layer is preferably formed between the electrode pad and the solder bump and between the connection pad and the solder bump in a region other than corner portions of the semiconductor chip.

In the example semiconductor device, the plurality of solder bumps preferably have substantially the same volume.

An example method for fabricating a semiconductor device, includes the steps of (a) selectively forming a plurality of electrode pads on an element formation surface of a semiconductor chip on which at least one element is formed, (b) after (a), forming a first barrier layer containing a metal as a major component on at least a portion of the plurality of electrode pads by electroless plating, (c) forming, on a principal surface of an interconnect substrate, connection pads at positions facing the respective corresponding electrode pads of the semiconductor chip, (d) after (c), forming a second barrier layer containing the metal as a major component on at least a portion of the plurality of connection pads facing the first barrier layer of the interconnect substrate by electroless plating, and (e) mounting the semiconductor chip onto the principal surface of the interconnect substrate by positioning the semiconductor chip and the interconnect substrate so that the electrode pads of the semiconductor chip face the respective corresponding connection pads of the interconnect substrate with the respective corresponding solder bumps being interposed therebetween, and bonding the semiconductor chip and the interconnect substrate together using the solder bumps.

According to the example method, the first barrier layer containing a metal as a major component is formed on at least a portion of the electrode pads of the semiconductor chip by electroless plating, and the second barrier layer containing the same metal as that contained in the first barrier layer as a major component is formed on at least a portion of the connection pads of the interconnect substrate facing the first barrier layer by electroless plating. As a result, for the solder bump contacting the first and second barrier layers, substantially the same composition is provided on a portion of the solder bump closer to the electrode pad and on a portion of the solder bump closer to the connection pad. Therefore, the semiconductor chip and the interconnect substrate apply substantially equal thermal stress to the solder bump, and therefore, a crack is more unlikely to occur in the solder bump.

In the example method, the metal contained in the first and second barrier layers may contain nickel as a major component.

The composition and production method of the first barrier layer containing nickel as a major component formed on the semiconductor chip by electroless plating and the second barrier layer (barrier metal layer) containing nickel as a major component formed on the interconnect substrate by electroless plating are not particularly limited as long as the barrier layers have substantially the same composition. Note that electroless nickel-phosphorus (Ni—P) plating which employs sodium hypophosphite as a reducing agent, or electroless nickel-boron (Ni—B) plating which employs dimethylaminoborane as a reducing agent is preferable in terms of ease of plating and cost. In particular, electroless nickel-phosphorus plating of the so-called medium phosphorus type having a phosphorus content of 5-10 wt % in plating film is preferable in terms of control of the plating growth rate and the hardness of plating.

In the example method, in step (b), the first barrier layer is preferably formed on the plurality of electrode pads other than those which are provided on corner portions of the semiconductor chip.

In the example method, in step (d), the second barrier layer is preferably formed on the plurality of connection pads other than those which face the electrode pads provided on corner portions of the semiconductor chip.

In this case, some of the solder bumps connecting the semiconductor chip and the interconnect substrate together which are formed on the corner portions of the semiconductor chip to which largest stress is applied, are connected (bonded) to the corresponding electrode pads or connection pads without a barrier layer being interposed therebetween. As a result, tensile stress which is caused by internal stress possessed by the barrier layer formed by electroless plating is not applied to those solder bumps. Therefore, bonding having high connection reliability can be obtained. Also, for example, copper contained in the connection pad of the interconnect substrate and tin contained in the solder bump form a copper-tin alloy, which is more rigid than a nickel-tin alloy. Therefore, the bonding strength between the solder bump and the electrode pad or the connection pad is increased, and therefore, stress (load) concentrated and applied to the corner portions of the semiconductor chip can be effectively reduced. As a result, it is possible to reduce or prevent a crack which would otherwise be caused by a temperature cycle test etc.

In the example method, the plurality of solder bumps preferably have substantially the same volume.

In this case, the method of forming the solder bumps is not limited.

The example method preferably further includes the step of (f) after step (e), filling a gap between the semiconductor chip and the interconnect substrate with an insulating resin material, and curing the insulating resin material.

In this case, the semiconductor chip can be more firmly bonded to the interconnect substrate.

According to the semiconductor device of the present disclosure and the method of fabricating the semiconductor device, a semiconductor device in which a semiconductor chip can be mounted with high connection reliability can be provided without limiting the method of forming solder bumps on the semiconductor chip and while causing a plurality of bonding portions of the solder bumps to have substantially the same area.

DETAILED DESCRIPTION

Embodiments and variations thereof below are for describing the best mode of carrying out the present disclosure. The present disclosure is not limited to the embodiments etc. described below.

First Embodiment

A first embodiment of the present disclosure will be described with reference to the accompanying drawings.

Figure 1:
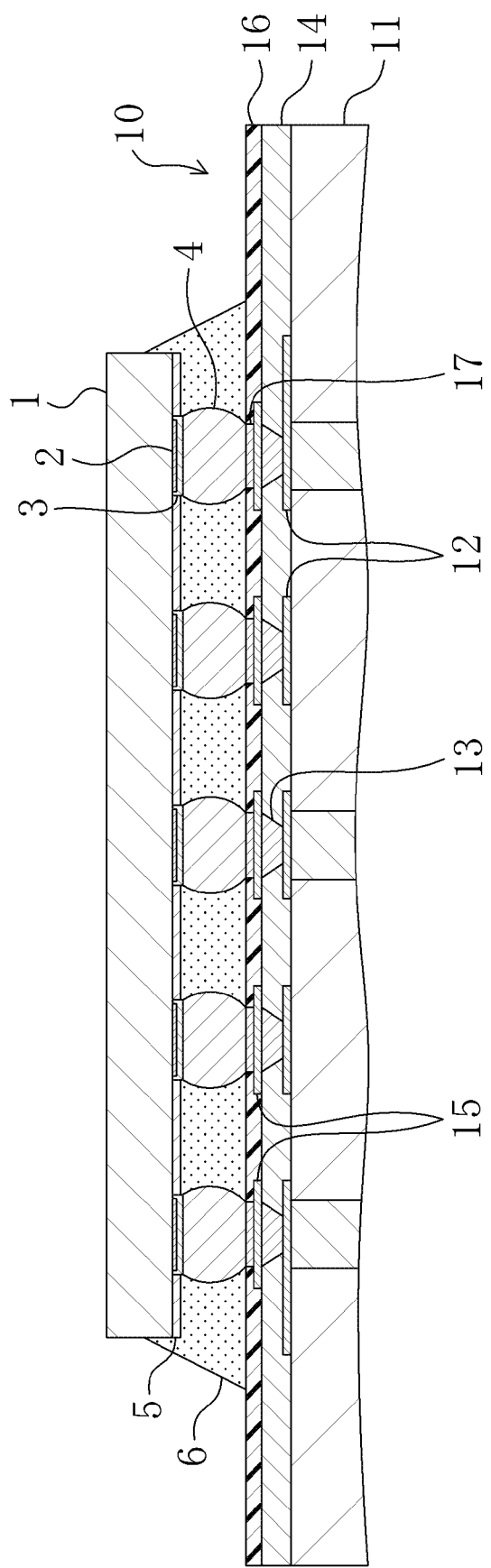
FIG. 1 is a partial cross-sectional view of a configuration of a semiconductor device according to a first embodiment of the present disclosure.

FIG. 1 is a cross-sectional view of a configuration of a flip chip semiconductor device according to the first embodiment of the present disclosure.

As shown in FIG. 1, a plurality of electrode pads 2 are formed on a principal surface of a semiconductor chip 1 on which semiconductor elements (not shown) are formed. A solder bump 4 is formed on each electrode pad 2 with an under bump metal (UBM) layer 3 which serves as a barrier layer being interposed therebetween. An insulating protective film 5 made of a polyimide resin is formed on the principal surface other than the electrode pads 2 of the semiconductor chip 1.

Here, the electrode pad 2 is, for example, made of aluminum (Al) having a thickness of 5 μm, and has, for example, a planar and circular shape having a diameter of 100 μm. The UBM layer 3 includes, for example, electroless nickel-phosphorus plating containing phosphorus (P) at a concentration of 5 wt % and having a thickness of 5 μm. A gold plating layer (not shown) having a thickness of 0.1 μm is formed on a surface of the UBM layer 3. The solder bump 4 is formed by, for example, forming on the UBM layer 3 a solder ball having a diameter of 100 μm m and a composition containing 96.5 wt % of tin (Sn), 3.0 wt % of silver (Ag), and 0.5 wt % of copper (Cu), and performing a reflow process in a nitrogen ($N_2$) gas atmosphere.

An example method of forming the UBM layer 3 will be described. Initially, a seed layer made of a metal which has the effect of preventing diffusion of tin, such as nickel (Ni), titanium (Ti), tungsten (W), chromium (Cr), tantalum (Ta), niobium (Nb), etc., or an alloy thereof, is formed on an entire surface of a wafer (before cleaved into the individual semiconductor chips 1) by sputtering or vacuum vapor deposition. Thereafter, a photoresist layer is formed on the seed layer by spin coating etc., and openings corresponding to regions where solder bumps are to be formed are formed in the photoresist layer by exposure and development. Next, the UBM layer 3 having a desired thickness is formed on the seed layer in the openings by electroless nickel plating. Thereafter, the photoresist layer is removed.

As an interconnect substrate (multilayer interconnect substrate) 10 on which the semiconductor chip 1 is to be mounted, a build-up substrate which is fabricated by a process called sequential build-up is typically used in order to increase the density of interconnects and reduce the weight, thickness, and cost. The build-up substrate is formed by alternately forming circuit patterns 12 and insulating layers on a glass epoxy substrate (core substrate) 11 which has been obtained by impregnating a glass cloth with an epoxy resin. A plurality of connection pads 15 for electrical connection to the semiconductor chip 1 are formed on a surface of the build-up substrate. The insulating layer is made of a thermosetting insulating resin. The circuit pattern 12 and the connection pad 15 are, in most cases, made of copper (Cu) which is formed by electroplating in order to improve the electrical conductivity, workability, and manufacturing cost.

Specifically, in the interconnect substrate 10, vias 13 for connection to the circuit pattern 12 are formed in an interlayer insulating resin layer 14 formed on the core substrate 11, and the connection pads 15 are formed on the respective corresponding vias 13. Here, the connection pad 15 has, for example, a planar and circular shape having a diameter of 100 μm. A barrier metal layer 17 is formed on the connection pads 15. As is similar to the UBM layer 3 of the semiconductor chip 1, the barrier metal layer 17 includes, for example, electroless nickel-phosphorus plating containing phosphorus (P) at a concentration of 5 wt % and having a thickness of 5 μm. A gold plating layer (not shown) having a thickness of 0.1 μm is formed on a surface of the barrier metal layer 17. A solder resist layer 16 is formed on the interlayer insulating resin layer 14 other than the connection pads 15.

A gap between the semiconductor chip 1 and the interconnect substrate 10 is filled with an underfill resin 6, and the semiconductor chip 1 is firmly bonded to the interconnect substrate 10 by the underfill resin 6.

In the first embodiment, the UBM layer 3 formed on the electrode pad 2 of the semiconductor chip 1 and the barrier metal layer 17 formed on the connection pad 15 of the interconnect substrate 10 are both formed of electroless nickel-phosphorus plating containing phosphorus at a concentration of 5 wt % and having a thickness of 5 μm. A gold plating layer having a thickness of 0.1 μm is formed on both of the UBM layer 3 and the barrier metal layer 17.

As a result, substantially the same composition is provided on a portion of the solder bump 4 facing the electrode pad 2 and on a portion of the solder bump 4 facing the connection pad 15. Moreover, the UBM layer 3 and the barrier metal layer 17 are both amorphous due to electroless plating. Therefore, the semiconductor chip 1 and the interconnect substrate 10 apply substantially equal thermal stresses to the solder bump 4. As a result, a crack occurring in the solder bump 4 can be reduced or prevented.

Thus, in the present disclosure, that substantially the same composition is provided on the portion of the solder bump 4 closer to the electrode pad 2 and on the portion of the solder bump 4 closer to the connection pad 15 does not mean only material composition or crystal structure. The components (the UBM layer 3 and the barrier metal layer 17) joined to the solder bump 4 preferably have substantially the same thickness and volume.

After fabrication, a preprocess (moisture absorption and preservation) was applied to the semiconductor device of the first embodiment under conditions specified in "JEDEC STANDARD TEST METHOD A113-A LEVEL3," and thereafter, a solder reflow test (preprocess) was conducted three times where the highest temperature was 260° C. Thereafter, a change in connection resistance value of an interconnect portion including the solder bump 4 formed between the semiconductor chip 1 and the interconnect substrate 10 was measured in a gas phase by a temperature cycle test (one cycle includes a process of holding at −55° C. for 30 min and a process of holding at 125° C. for 30 min). As a result, even after 1,000 cycles, which is a criterion for reliability evaluation, the change rate of the connection resistance value was +10% or less with respect to the initial resistance value. Even after 1,500 cycles, the change rate of the connection resistance value was +10% or less with respect to the initial resistance value. Therefore, it was confirmed that the semiconductor device of the first embodiment has good endurance to the temperature cycle test (i.e., repetitive changes in temperature).

First Variation of First Embodiment

Note that, as a variation of the first embodiment, the UBM layer 3 formed on the electrode pad 2 of the semiconductor chip 1 and the barrier metal layer 17 formed on the connection pad 15 of the interconnect substrate 10 may both be formed of nickel-phosphorus electroplating containing phosphorus at a concentration of 5 wt % and having a thickness of 5 μm. In this case, the UBM layer 3 and the barrier metal layer 17 are both crystalline due to electroplating, and therefore, the semiconductor chip 1 and the interconnect substrate 10 apply substantially equal thermal stresses to the solder bump 4. Therefore, a crack occurring in the solder bump 4 can be reduced or prevented.

Second Variation of First Embodiment

As a second variation, the thickness of the electroless nickel-phosphorus plating included in the UBM layer 3 formed on the electrode pad 2 of the semiconductor chip 1 and the thickness of the electroless nickel-phosphorus plating included in the barrier metal layer 17 formed on the connection pad 15 of the interconnect substrate 10 are both set to be 10 μm instead of 5 μm.

Also in the second variation, a temperature cycle test similar to those of the first embodiment was conducted. As a result, after 1,000 cycles, which is a criterion for reliability evaluation, the change rate of the connection resistance value was +10% or less with respect to the initial resistance value. After 1,500 cycles, the change rate of the connection resistance value was also +10% or less with respect to the initial resistance value. Therefore, it was confirmed that the semiconductor device of the second variation has good endurance to repetitive changes in temperature.

Second Embodiment

A second embodiment of the present disclosure will be described hereinafter with reference to the drawings.

Figure 2:
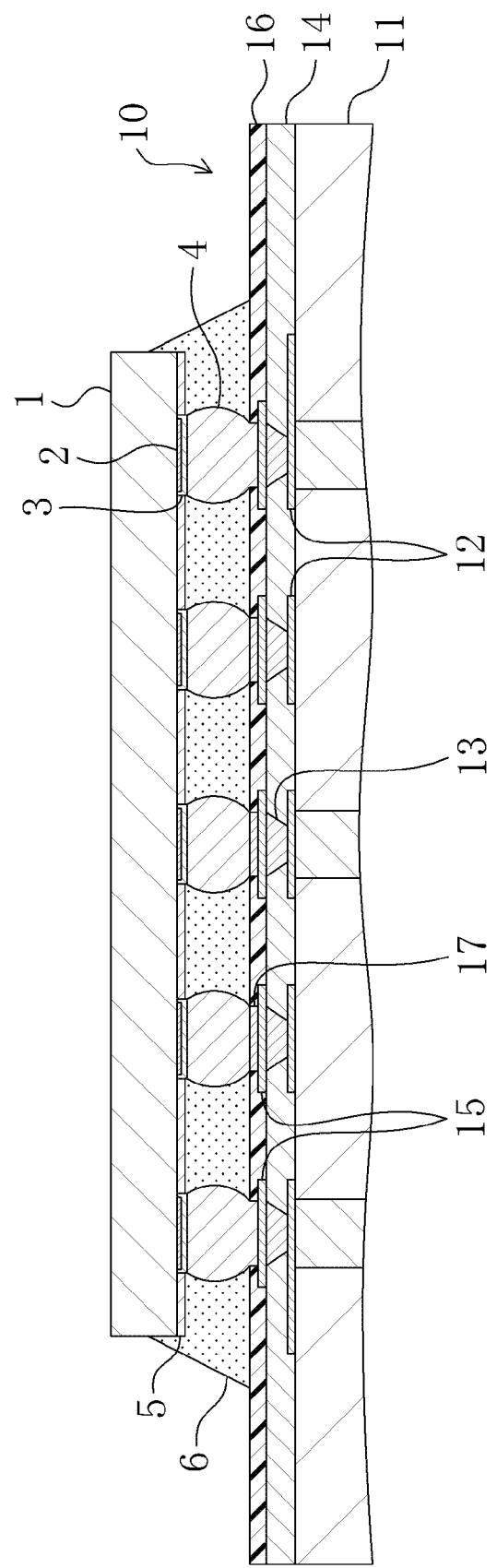
FIG. 2 is a partial cross-sectional view of a configuration of a semiconductor device according to a second embodiment of the present disclosure.

FIG. 2 is a cross-sectional view of a configuration of a flip chip semiconductor device according to the second embodiment of the present disclosure. In FIG. 2, the same parts as those of FIG. 1 are indicated by the same reference characters.

As shown in FIG. 2, in the semiconductor device of the second embodiment, the barrier metal layer 17 is not formed on some of the connection pads 15 provided on the interconnect substrate 10 which are joined to the solder bumps 4 provided on the four corner portions of the semiconductor chip 1.

Thus, some of the solder bumps 4 which are formed on the corner portions of the semiconductor chip 1 to which the largest stress is applied are not joined to the barrier metal layer 17 on the connection pads 15 of the interconnect substrate 10. As a result, tensile stress which would otherwise occur due to internal stress which is possessed by the compound film containing nickel formed by electroless plating is not applied to those solder bumps 4. Therefore, bonding which can provide highly reliable connection can be achieved by the solder bumps 4.

Moreover, copper contained in the connection pad 15 of the interconnect substrate 10 and tin contained in the solder bump 4 form a copper-tin alloy, which is more rigid than a nickel-tin alloy. Therefore, the bonding strength between the solder bump 4 and the connection pad 15 is increased, and therefore, stress (load) concentrated and applied to corner portions of the semiconductor chip 1 can be effectively reduced. As a result, for example, a semiconductor device in which the entire semiconductor chip 1 has a high bonding strength can be obtained while reducing or preventing a crack which would otherwise be caused by a temperature cycle test.

Figure 3:
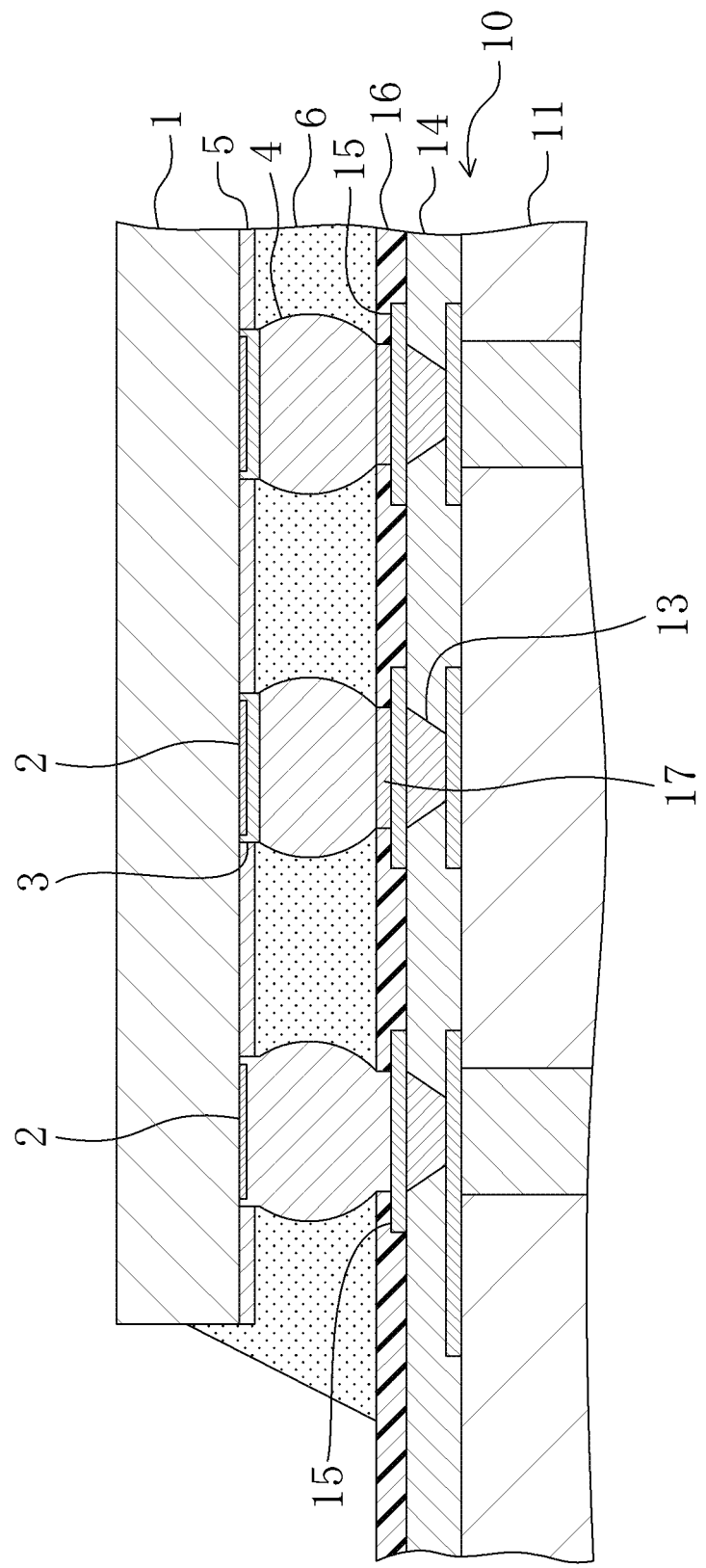
FIG. 3 is a partial cross-sectional view of a configuration of a semiconductor device according to a first variation of the second embodiment of the present disclosure.

Note that, as in the first variation of FIG. 3, the UBM layer 3 formed on the electrode pads 2 of the semiconductor chip 1 may not be formed on the corner portions of the semiconductor chip 1. In this case, if copper is used as a metal contained in the metal electrode pad 2 instead of aluminum, the copper-tin alloy is also formed in a portion closer to the semiconductor chip 1 of each of the solder bumps 4 provided on the four corner portions of the semiconductor chip 1. As a result, the bonding strength of the entire semiconductor chip 1 can be further increased.

A method for fabricating the semiconductor device thus configured will be described hereinafter with reference to the drawings. FIGS. 4-9 are cross-sectional views of a configuration of the semiconductor device of the second embodiment of the present disclosure in the order in which the semiconductor device is fabricated.

Figure 4:
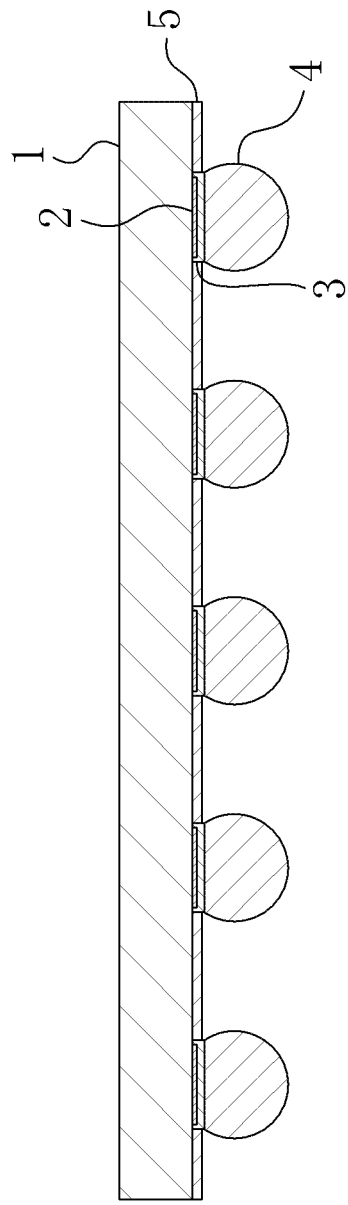
FIG. 4 is a cross-sectional view for describing a method of fabricating the semiconductor device of the second embodiment of the present disclosure, showing a semiconductor chip which is before being mounted.

Initially, as shown in FIG. 4, the semiconductor chip 1 on which the solder bumps 4 are formed are prepared. Here, the semiconductor chip 1 has a configuration similar to that of the first embodiment.

Figure 5:
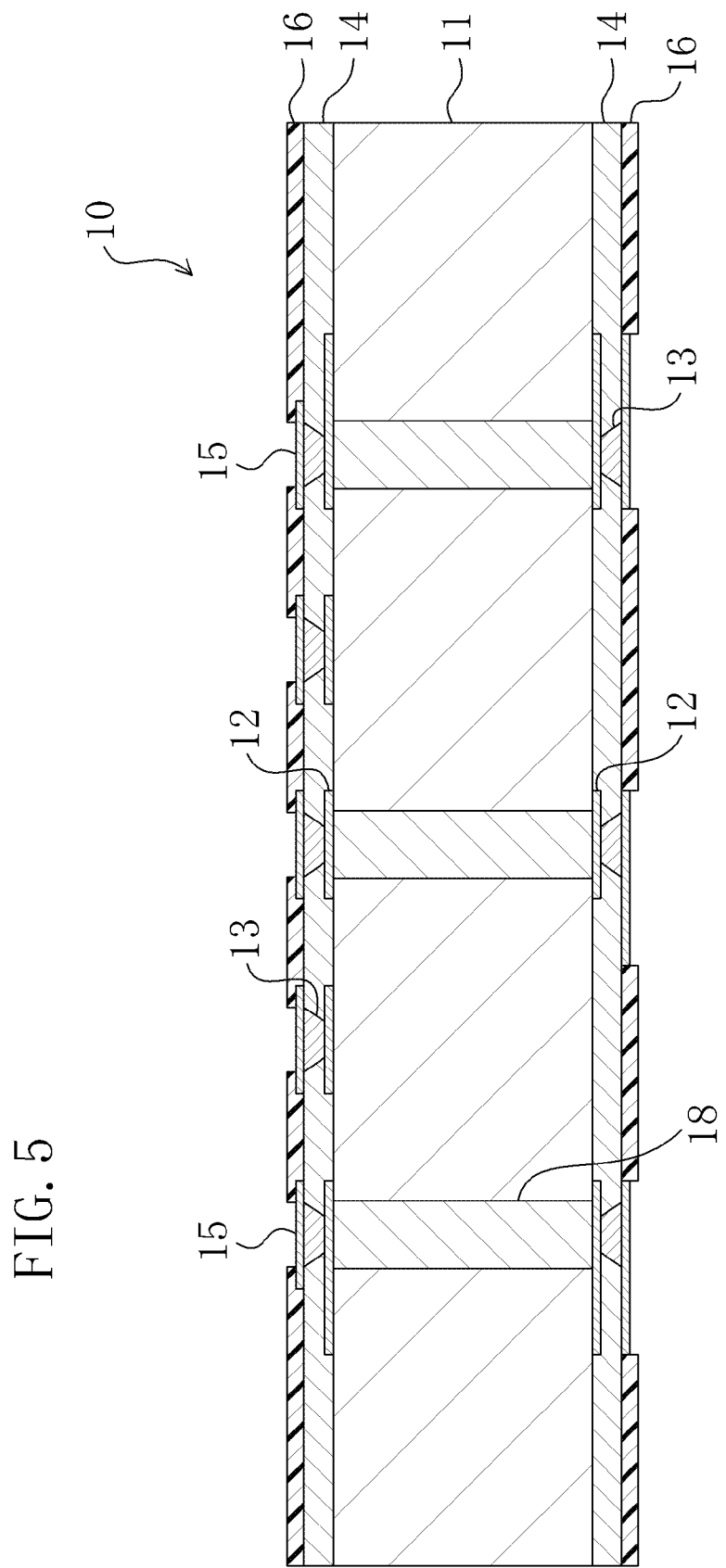
FIG. 5 is a cross-sectional view for describing the method of fabricating the semiconductor device of the second embodiment of the present disclosure, showing an interconnect substrate before a barrier metal layer has been formed thereon, onto which the semiconductor chip is to be mounted.

Next, an interconnect substrate 10 shown in FIG. 5 is prepared. In the interconnect substrate 10 of FIG. 5, the barrier metal layer 17 has not yet been formed on the connection pads 15.

The interconnect substrate 10 is fabricated as follows. The aforementioned build-up substrate is employed. The interlayer insulating resin layer 14 and the circuit pattern 12 are successively formed and stacked on the core substrate 11 including a glass cloth. Via holes are formed in the interlayer insulating resin layer 14. Vias for electrical connection are formed in the via holes.

More specifically, for example, metal foil having a thickness of 15 µm is attached by application of pressure and heat to each of opposite surfaces of the core substrate 11 (including a glass cloth) having a thickness of 0.4 mm. Thereafter, holes penetrating through the core substrate 11 including the attached metal foil are formed using carbon dioxide laser in order to electrically connect interconnect layers on the front and back surfaces of the core substrate 11 together. Next, the holes are filled with electroless copper plating and copper electroplating to form contact plugs 18. Next, the metal foil layers are etched to perform patterning to form the circuit patterns 12 on the core substrate 11.

The core substrate 11 includes a glass cloth and a thermosetting resin. The thermosetting resin is an epoxy resin. Note that, instead of the epoxy resin, for example, a composition containing one or more thermosetting resins having high heat resistance, such as bismaleimide triazine, thermosetting polyphenylene ether, etc., may be used. Here, the metal foil is copper foil formed by electroplating.

Next, a thermosetting resin including an epoxy resin which is previously formed in the shape of film, and the interlayer insulating resin layer 14 containing 50 vol % of spherical silica particles having an average particle diameter of 5 µm as an inorganic filler, are attached by application of pressure and heat to the core substrate 11 on which the circuit patterns 12 have been formed. The thermosetting resin used for the interlayer insulating resin layer 14 may be a resin having high heat resistance, such as bismaleimide triazine, thermosetting polyphenylene ether, etc., in addition to an epoxy resin. The interlayer insulating resin layer 14 may be formed by applying an uncured liquid varnish by screen printing or spin coating. The inorganic filler is added in order to reduce the coefficient of thermal expansion and improve the modulus of elasticity while maintaining the insulating property of the interlayer insulating resin layer 14. The inorganic filler may be a spherical filler or a pulverized filler made of alumina, aluminum hydroxide, barium titanate, etc. instead of silica.

Next, closed-bottom via holes which reach the lower circuit pattern 12 are formed in the interlayer insulating resin layer 14 in the depth direction using carbon dioxide laser light. The closed-bottom via hole may be formed using a laser processing device employing third harmonic neodymium-yttrium aluminum garnet (Nd-YAG) laser light, deep ultraviolet excimer laser light having a wavelength of less than 300 nm, etc., instead of carbon dioxide laser.

Next, an electroless copper plating film having a thickness of 0.5 µm is formed in the closed-bottom via holes formed in the interlayer insulating resin layer 14, and moreover, electroplating is applied thereto, to form a plating film having a thickness of 15 µm in the closed-bottom via holes. Thereafter, a photosensitive dry film resist is attached by application of pressure and heat to a surface of the plating film. Next, a glass mask having a negative image of a desired circuit pattern is positioned. Thereafter, exposure and development are performed to form an etching resist in which portions other than the circuit pattern of the plating film are exposed. Next, etching is performed using the etching resist as a mask, and the etching resist is then removed. As a result, the desired circuit pattern 12 is formed on the interlayer insulating resin layer 14. Thereafter, although not shown, on the interlayer insulating resin layer 14, a plurality of other interlayer insulating resin layers 14 and circuit patterns 12 are formed. Therefore, the uppermost circuit pattern 12 is formed as the connection pads 15.

Next, a solder resist resin containing a photosensitive epoxy resin is applied to an upper surface and a lower surface of the interconnect substrate 10 in order to avoid a short circuit between adjacent solder bumps which would otherwise occur during solder bonding by flip chip mounting. Next, exposure and development are applied to the applied solder resist resin to form the solder resist layers 16. Note that the solder resist layer 16 is not limited to a photosensitive material, and may be prepared using any other technique as long as a desired shape is obtained. For example, laser light, such as carbon dioxide laser, third harmonic Nd-YAG laser, deep ultraviolet excimer laser having a wavelength of less than 300 nm, etc., may be used. Here, it is assumed that the solder resist layer 16 has a thickness of 20 μm, and the solder bump formation portion on the connection pad 15 has an opening having a diameter of 100 μm.

Figure 6:
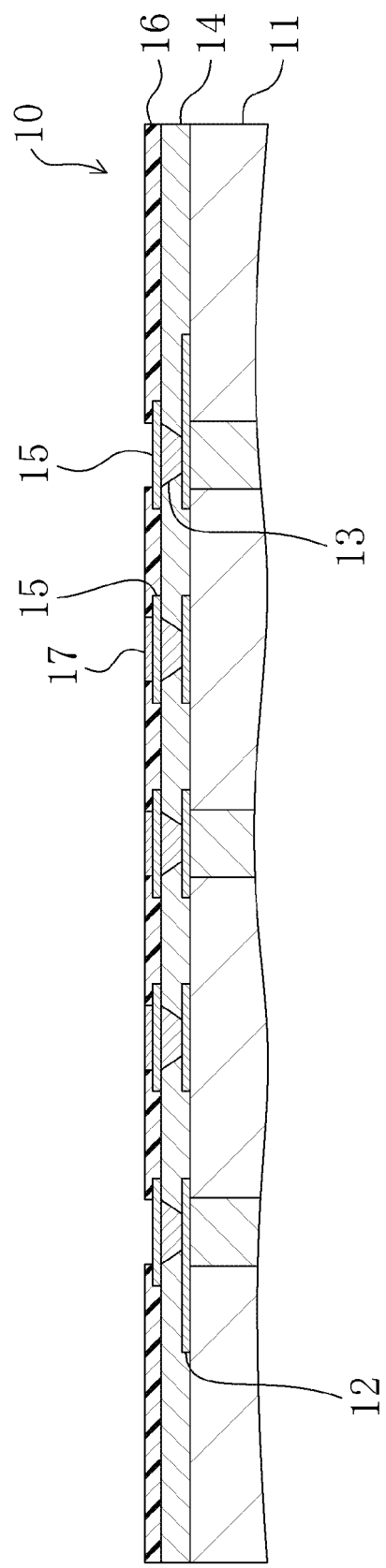
FIG. 6 is a partial cross-sectional view for describing the method of fabricating the semiconductor device of the second embodiment of the present disclosure, showing the interconnect substrate after a barrier metal layer has been selectively formed thereon.

Next, as shown in FIG. 6, the barrier metal layer 17 is formed on the connection pads 15 other than those which face the four corner portions of the semiconductor chip 1.

Specifically, initially, some of the connection pads 15 formed on the interconnect substrate 10 which face the solder bumps 4 provided on the corner portions of the semiconductor chip 1 are covered with a dry film resist. Thereafter, electroless nickel-phosphorus plating containing phosphorus at a concentration of 5 wt % is formed as the barrier metal layer 17 on the other connection pads 15 which are exposed through the openings of the solder resist layer 16. Next, by performing a gold plating process, the barrier metal layer 17 including electroless nickel-phosphorus plating having a thickness of 5 μm and gold plating having a thickness of 0.1 μm is formed on the connection pads 15 which are provided on the corner portions of the semiconductor chip 1 and do not face any electrode pad 2. Thereafter, the dry film resist is removed. Here, the number of connection pads 15 provided facing each of the four corner portions of the semiconductor chip 1 is not limited to one. In other words, a plurality of connection pads 15 may be provided on each corner portion.

Figure 7:
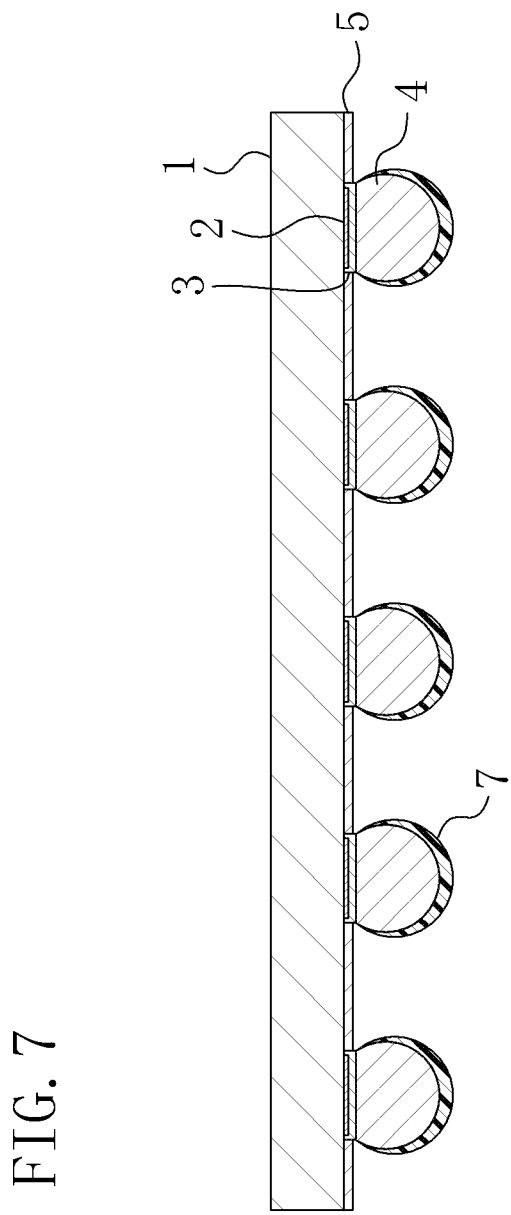
FIG. 7 is a cross-sectional view for describing the method of fabricating the semiconductor device of the second embodiment of the present disclosure, showing solder bumps on the semiconductor chip after a flux has been applied thereon.

Next, as shown in FIG. 7, a flux 7 is attached to surfaces of the solder bumps 4 formed on the electrode pads 2 of the semiconductor chip 1 with the UBM layer 3 being interposed between the solder bumps 4 and the electrode pads 2. The method of attaching the flux 7 is not particularly limited as long as the flux 7 flows and spreads over the surface of each solder bump 4 and the flux 7 does not adhere to the insulating protective film 5 formed on the semiconductor chip 1. For example, the solder bumps 4 formed on the semiconductor chip 1 may be immersed in the flux 7 which is uniformly applied to a flat surface and has a height larger than that of the solder bump 4. In this embodiment, by immersing the solder bumps 4 formed on the semiconductor chip 1 in a flux film having a thickness of 50 μm, the flux 7 is caused to adhere to the solder bumps 4. In this case, because of wetting of the flux 7 on the solder bump 4, the flux 7 spreads to a portion of the surface of the solder bump 4 which is not immersed, and therefore, the surface of the solder bump 4 can be uniformly covered with the flux 7.

Figure 8:
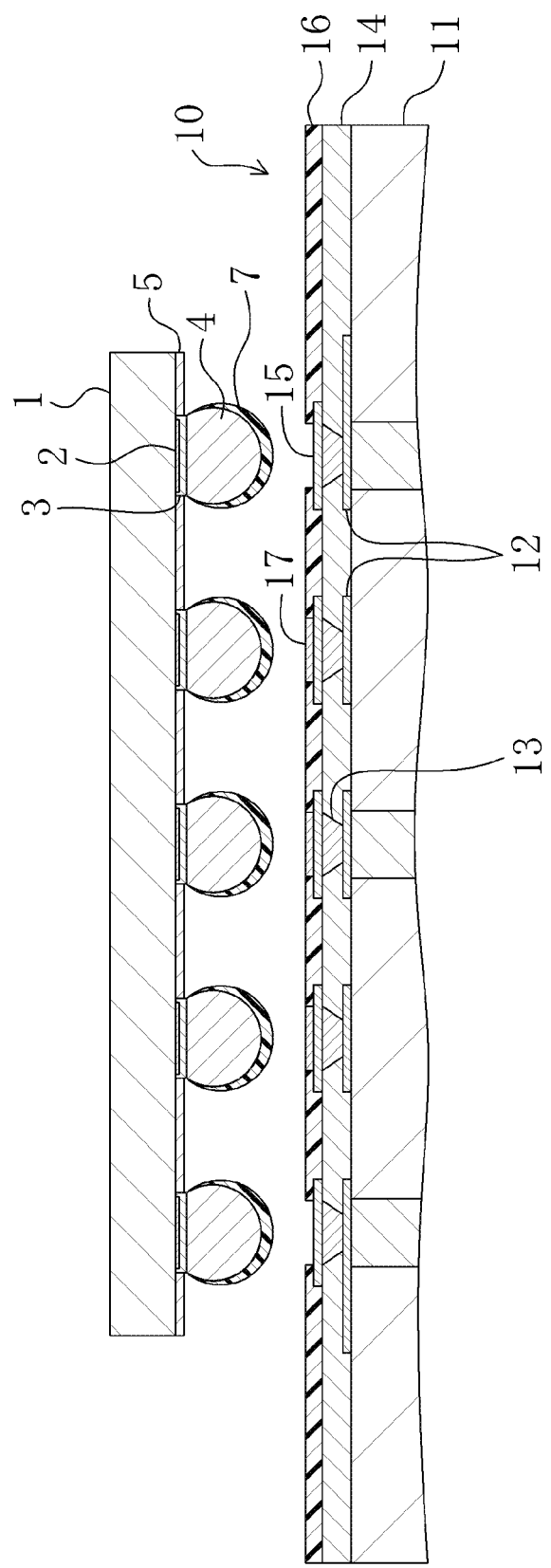
FIG. 8 is a partial cross-sectional view for describing the method of fabricating the semiconductor device of the second embodiment of the present disclosure, showing the semiconductor chip and the interconnect substrate just before the semiconductor chip has been mounted on the interconnect substrate.

Next, as shown in FIG. 8, the semiconductor chip 1 is placed in a predetermined position of the interconnect substrate 10, and is then mounted onto the interconnect substrate 10. Just after the mounting step, the solder bumps 4 of the semiconductor chip 1 contact the connection pads 15 or the barrier metal layer 17 of the interconnect substrate 10 with the flux 7 being interposed therebetween, and solder bonding has not yet been performed.

Figure 9:
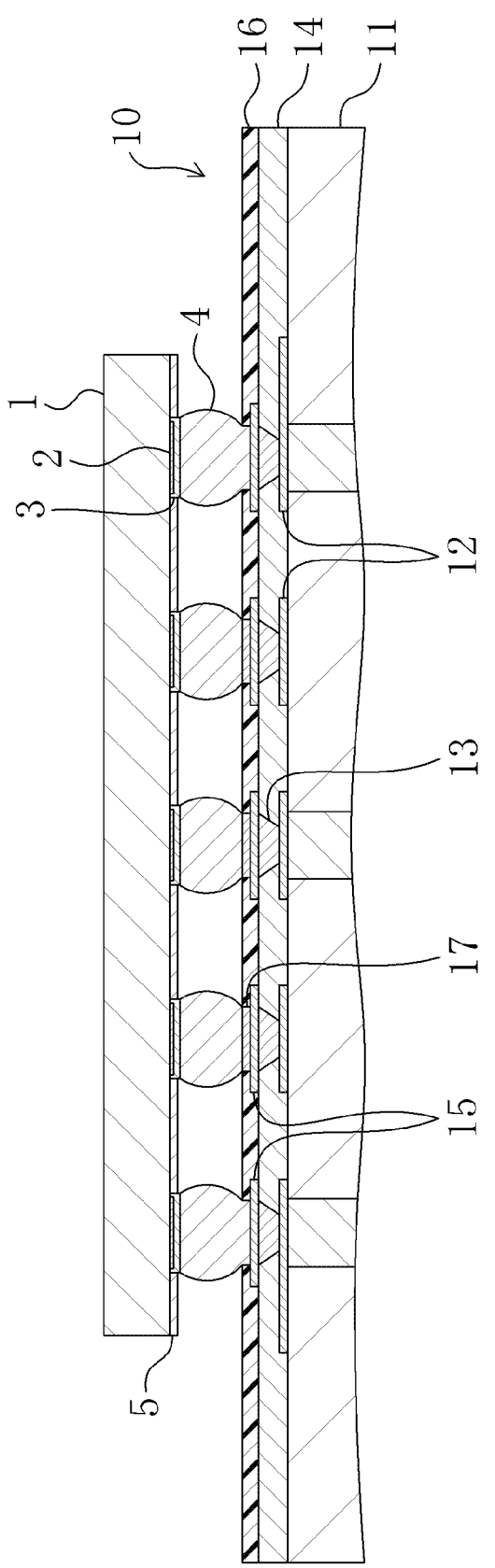
FIG. 9 is a partial cross-sectional view for describing the method of fabricating the semiconductor device of the second embodiment of the present disclosure, showing the semiconductor chip and the interconnect substrate just after the semiconductor chip has been mounted on the interconnect substrate.

Next, as shown in FIG. 9, the interconnect substrate 10 on which the semiconductor chip 1 has been mounted is placed in a solder reflow apparatus, and is heated for 20 sec or more in a nitrogen atmosphere at a temperature which is higher by 30° C. or more than a temperature (melting point 217° C.) at which a copper solder melts which is contained in the solder bump 4 and has a composition of 96.5 wt % of tin, 3.0 wt % of silver, and 0.5 wt % of copper. As a result, a flip chip assembly is obtained in which the solder bumps 4 are formed at connection portions between the semiconductor chip 1 and the interconnect substrate 10.

Thereafter, the flux remaining around the solder bumps 4 is removed by washing. The washing is performed as follows. The flip chip assembly in which the semiconductor chip 1 has been mounted on the interconnect substrate 10 as shown in FIG. 9 is completely immersed in a washing liquid, and an ultrasonic wave having a frequency of 100 kHz and a power of 100 W is applied to the flip chip assembly for 5 min. Thereafter, the flip chip assembly is removed from the washing liquid and then quickly subject to a rinsing process using deionized water for 5 min. By thus performing the ultrasonic process in the washing liquid, the washing liquid effectively enters a gap between the semiconductor chip 1 and the interconnect substrate 10 in the flip chip assembly, thereby efficiently removing the flux 7 remaining in the gap. After the mounting, the semiconductor chip 1 (dummy sample) was removed to check a region around the solder bump 4. As a result, a residue of the flux 7 was not observed around the solder bump 4.

When the power of the ultrasonic wave during washing was set to be higher than 1,000 W in order to improve the effect of washing, a crack occurred in the solder bump 4 and an interface between the solder bump 4 and the connection pad 15 or the electrode pad 2. When the power was set to be lower than 50 W, substantially no flux residue was removed. When the emission frequency of the ultrasonic wave was set to be higher than 600 kHz and when the emission frequency was set to be lower than 50 kHz, substantially no flux residue was removed. When the washing time and the rinsing time exceeded one min, the degree of removal of flux residue does not vary depending on these times. The ultrasonic process which continues for a long time, however, causes the interconnect substrate 10 to absorb moisture, leading to swelling or delamination of the interconnect substrate 10 during a subsequent thermal treatment step. Therefore, the washing time is preferably 10 min or less.

Next, after the washing, the flip chip assembly is baked in a nitrogen atmosphere at a temperature of 115° C. to 125° C. for 1 hr. When the baking time is less than 1 hr or when the baking temperature is lower than 115° C., water adsorbed in the surface of the interconnect substrate 10 is not sufficiently removed. Therefore, in a subsequent underfill step, the wettability of the underfill resin 6 to the solder resist layer 16 is lowered, so that the gap between the semiconductor chip 1 and the interconnect substrate 10 is not sufficiently filled with the underfill resin 6. When the baking time is 3 hrs or more or when the baking temperature exceeds 125° C., the surface of the solder resist layer 16 is discolored.

Next, an underfill application apparatus is used to apply the uncured underfill resin 6 to the gap between the semiconductor chip 1 and the interconnect substrate 10 in the flip chip assembly. The underfill resin 6 is applied in a predetermined amount to the longest side of the four sides of the outer shape of the semiconductor chip 1, and the viscosity of the applied underfill resin 6 is reduced to increase the ease of penetration into the gap. Therefore, the underfill resin 6 is applied while the interconnect substrate 10 on which the semiconductor chip 1 has been mounted as shown in FIG. 9 is kept at a temperature of about 65° C., and after the application, the flip chip assembly is allowed to stand at a temperature of 65° C.

for 10 min. Thus, by utilizing the ability of penetration of the underfill resin 6, the underfill resin 6 is caused to penetrate into the gap between the semiconductor chip 1 and the interconnect substrate 10.

Next, the flip chip assembly to which the underfill resin 6 has been applied is placed into an oven, and then subjected to a curing process for 1 hr in a nitrogen atmosphere at a temperature of 145° C. to 155° C. As a result, the semiconductor device of FIG. 2 is obtained. The uncured underfill resin 6 is cured by the thermal treatment, so that each solder bump 4 is encapsulated with the underfill resin 6. Therefore, the bonding portion of the solder bump 4 can be protected from compressive stress or shear stress which is caused by entrance of external water, external stress, thermal deformation, or internal residual stress.

Here, when the curing temperature of the underfill resin 6 is less than 130° C. or when the curing time is less than 1 hr, the underfill resin 6 is not sufficiently cured. Therefore, for example, electrical insulation is decreased due to entrance of water, i.e., the encapsulation effect is insufficient. In this case, the bonding portion of the solder bump 4 is destroyed when local stress is applied thereto due to vibration or thermal deformation. When the curing temperature of the underfill resin 6 exceeds 170° C. or when the curing time exceeds 3 hrs, the interconnect substrate 10 is deformed due to an excessive curing reaction of the underfill resin 6. Moreover, the bonding portion of the solder bump 4 or an inner portion of the interconnect substrate 10 may be destroyed or peeled off.

As described above, in the semiconductor device of the second embodiment, some of the solder bumps 4 bonding the semiconductor chip 1 to the interconnect substrate 10 which are provided on the corner portions of the semiconductor chip 1 to which largest stress is applied are joined to the interconnect substrate 10 without the connection pad 15 and the barrier metal layer 17 being interposed therebetwen. As a result, tensile stress caused by internal stress possessed by a compound film (the barrier metal layer 17) containing nickel formed by electroless plating, is not applied to the bonding portion of the solder bump 4. Therefore, the connection reliability of the bonding portion of the solder bump 4 formed on each of the corner portions of the semiconductor chip 1 is further improved.

Moreover, as described above, copper contained in the connection pad 15 of the interconnect substrate 10 and tin contained in the solder bump 4 form a copper-tin alloy, which is more rigid than a nickel-tin alloy. Therefore, the bonding strength of the solder bumps 4 provided on the corner portion of the semiconductor chip 1 with respect to the connection pad 15 of the interconnect substrate 10 is improved. Therefore, stress (load) concentrated to each corner portion of the semiconductor chip 1 is effectively reduced, whereby the bonding strength of the entire semiconductor chip 1 can be further improved while reducing or preventing a crack which would otherwise be caused by a temperature cycle test etc.

After fabrication, the semiconductor device of the second embodiment was tested in a manner similar to that of the first embodiment. As a result, even after 1,000 cycles, which is a criterion for reliability evaluation, the change rate of the connection resistance value was +10% or less with respect to the initial resistance value. Even after 1,500 cycles, the change rate of the connection resistance value was +10% or less with respect to the initial resistance value. Therefore, it was confirmed that the semiconductor device of the second embodiment has good endurance to the temperature cycle test.

First Variation of Second Embodiment

As a first variation, the thickness of the electroless nickel-phosphorus plating included in the UBM layer 3 formed on the electrode pad 2 of the semiconductor chip 1 and the thickness of the electroless nickel-phosphorus plating included in the barrier metal layer 17 formed on the connection pad 15 of the interconnect substrate 10 are both set to be 10 μm instead of 5 μm.

Also for the first variation, a temperature cycle test similar to those of the first and second embodiments was conducted. As a result, after 1,000 cycles, which is a criterion for reliability evaluation, the change rate of the connection resistance value was +10% or less with respect to the initial resistance value. After 1,500 cycles, the change rate of the connection resistance value was also +10% or less with respect to the initial resistance value. Therefore, it was confirmed that the semiconductor device of the first variation has good endurance to repetitive changes in temperature.

Second Variation of Second Embodiment

As a second variation, electroless nickel-boron plating is used instead of each of the electroless nickel-phosphorus plating included in the UBM layer 3 formed on the electrode pad 2 of the semiconductor chip 1 and the electroless nickel-phosphorus plating included in the barrier metal layer 17 formed on the connection pad 15 of the interconnect substrate 10. The electroless nickel-boron plating layers both have a thickness of 5 μm.

In the second variation, a temperature cycle test similar to those of the first and second embodiments was conducted. As a result, after 1,000 cycles, which is a criterion for reliability evaluation, the change rate of the connection resistance value was +10% or less with respect to the initial resistance value. Note that, after 1,500 cycles, the change rate of the connection resistance value was more than +10% with respect to the initial resistance value, i.e., a failure occurred. In order to find a cause for the resistance change, the failure mode of the semiconductor device after the temperature cycle test was analyzed. As a result, a crack was observed in the electroless nickel-boron plating (the barrier metal layer 17 of the interconnect substrate 10) which is joined to the solder bump 4 where an increase in resistance occurred.

Thus, even when electroless nickel-boron plating is used as the UBM layer 3 and the barrier metal layer 17 instead of electroless nickel-phosphorus plating, the change rate of the connection resistance value after 1,000 cycles, which is a criterion for reliability evaluation, is +10% or less with respect to the initial resistance value, and therefore, the reliability evaluation criterion is satisfied.

Third Variation of Second Embodiment

As a third variation, the thickness of the electroless nickel-phosphorus plating included in the barrier metal layer 17 formed on the connection pad 15 of the interconnect substrate 10 is set to be 10 μm instead of 5 μm. On the other hand, the thickness of the UBM layer 3 formed on the electrode pad 2 of the semiconductor chip 1 is 5 μm again.

In the third variation, a temperature cycle test similar to those of the first and second embodiments was conducted. As a result, after 1,000 cycles, which is a criterion for reliability evaluation, the change rate of the connection resistance value was +10% or less with respect to the initial resistance value. After 1,500 cycles, however, the change rate of the connection resistance value was more than +10% with respect to the initial resistance value, and a break occurred in a line.

In order to find a cause for the broken line, the failure mode of the semiconductor device after the temperature cycle test was analyzed. As a result, it was confirmed that a portion where an increase in resistance occurred does not correspond to the solder bumps 4 formed on the corner portions of the semiconductor chip 1, but corresponds to a crack which occurred in a portion close to the barrier metal layer 17 of the interconnect substrate 10 of other solder bumps 4.

As described above, it is important that the UBM layer 3 of the semiconductor chip 1 and the barrier metal layer 17 of the interconnect substrate 10, which are barrier films bonded to the solder bumps 4, have substantially the same thickness, i.e., have substantially the same composition in the bonding portions.

As described above, according to the semiconductor devices of the second embodiment and its variations, some of the solder bumps 4 bonding the semiconductor chip 1 to the interconnect substrate 10 which are formed on the corner portions of the semiconductor chip 1 to which largest stress is applied are bonded to portions of the interconnect substrate 10 where the barrier metal layer 17 is not formed on the connection pad. As a result, the connection pad 15 made of copper of the interconnect substrate 10 is directly bonded to the solder bump 4 without the barrier metal layer 17 being interposed therebetween. Therefore, nickel which is a major component of the barrier metal layer 17 and tin which is a major component of the solder bump 4 do not form a nickel-tin alloy, which is fragile to friction stress in a direction parallel to the principal surface of the interconnect substrate 10, in the bonding portion to which load is applied in the temperature cycle test. Bonding is formed by a copper-tin alloy, which has high resistant to friction stress, instead of the fragile nickel-tin alloy. In addition, tensile stress caused by internal stress possessed by electroless nickel-based plating films is not applied. Therefore, the bonding strength of an interface portion between the solder bump 4 and the connection pad 15 of the interconnect substrate 10 is improved, and therefore, stress concentrated and applied to the corner portions of the semiconductor chip 1 is effectively reduced.

For the solder bumps 4 other than those which are provided on the corner portions of the semiconductor chip 1, the barrier metal layer 17 needs to be provided on the interconnect substrate 10 in order to improve solderability when the semiconductor chip 1 is mounted onto the interconnect substrate 10, and reduce or prevent surface oxidation due to changes over time during a time period after fabrication and before mounting of the interconnect substrate 10. Therefore, the UBM layer 3 of the semiconductor chip 1 on a side farther from the connection pad 15 of the solder bump 4 preferably includes electroless nickel-based plating having substantially the same composition and thickness (volume) as those of the barrier metal layer 17. With this structure, the barrier metal layer 17 and the UBM layer 3 apply substantially equal tensile stresses in substantially the same direction to the solder bumps 4 other than those which are provided on the corner portions of the semiconductor chip 1.

As a result, the direction of stress in the bonding surface of the solder bump 4 is more unlikely to be nonuniform. Therefore, it is possible to reduce or prevent a crack which would otherwise occur in the solder bump 4 during the mounting step, the temperature cycle test, etc. Therefore, the flip chip assembly substantially free from a crack can be formed without specifically changing the size of the solder bump 4 provided on the semiconductor chip 1.

Comparative Example

A comparative example will be described hereinafter with reference to the drawings.

Figure 10:
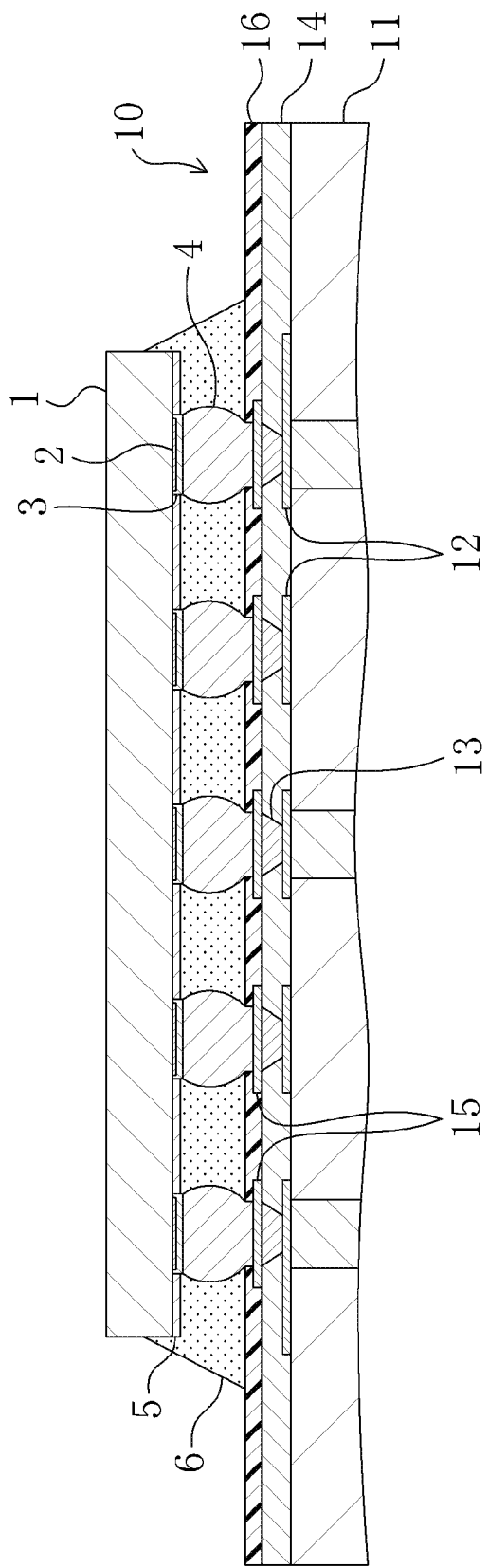
FIG. 10 is a partial cross-sectional view of a semiconductor device of a comparative example.

FIG. 10 is a partial cross-sectional view of a configuration of a semiconductor device according to a comparative example.

An interconnect substrate 10A of the comparative example has a structure in which a barrier metal layer is not formed on any of connection pads 15 which are connected to electrode pads 11 of a semiconductor chip 1 via solder bumps 4.

The interconnect substrate 10A of the comparative example is fabricated in a manner similar to that of the first and second embodiments until the solder resist layer 16 is formed. The barrier metal layer 17 is subsequently not formed and the interconnect substrate 10A is completed. The semiconductor chip 1 is mounted onto the interconnect substrate 10A under conditions similar to those of the first embodiment.

In the comparative example, when the semiconductor chip 1 and the interconnect substrate 10A are bonded together using the solder bumps 4, bonding interfaces between all the solder bumps 4 and the semiconductor chip 1 are made of a nickel tin ($Ni_6Sn_5$ and $Ni_3Sn_4$), which is fragile to horizontal friction stress.

On the other hand, bonding interfaces between all the solder bumps 4 and the interconnect substrate 10A are made of a copper-tin alloy of copper contained in the connection pads 15 and tin contained in the solder bumps 4, which is more rigid than a nickel-tin alloy. Therefore, the upper and lower bonding interfaces of all the solder bumps 4 form bonding portions having different compositions. Therefore, when thermal stress is applied to the semiconductor device, tensile stress is uniformly applied to the bonding portions on the interconnect substrate 10A. As a result, stress applied to each corner portion of the semiconductor chip 1 of the nickel-tin alloy portions having a lower bonding strength on the semiconductor chip 1 cannot be reduced.

Therefore, the temperature cycle test is likely to cause a crack in the bonding portion closer to the semiconductor chip 1 of the solder bump 4 formed at each corner portion of the semiconductor chip 1.

In the case of the semiconductor device of the comparative example, it was confirmed that, in the temperature cycle test, after 750 cycles, the change rate of the connection resistance value was +10% or more with respect to the initial resistance value, and after 1,250 cycles, a break occurred in a line, i.e., the endurance to temperature changes is lower.

In order to find a cause for the broken line, the failure mode of the semiconductor device after the temperature cycle test (1,250 cycles) was analyzed. As a result, a crack was observed in an interface portion of a bonding portion between the UBM layer 3 and the solder bump 4 on the electrode pad 2 provided on a corner portion of the semiconductor chip 1.

In the semiconductor device of the present disclosure and the method of fabricating the semiconductor device, the semiconductor chip can be mounted with high connection reliability while a plurality of bonding portions of solder bumps are caused to have substantially the same area, without limiting the method of forming the solder bumps on the semiconductor chip. Therefore, the present disclosure is useful for various electronic apparatuses which are fabricated by flip chip mounting using solder bumps.

What is claimed is:

1. A semiconductor device comprising:
    a semiconductor chip having an element formation surface on which at least one element is formed and including a plurality of electrode pads formed on the element formation surface;
    an interconnect substrate having a principal surface facing the element formation surface of the semiconductor chip and including a plurality of connection pads formed at positions of the principal surface facing the respective corresponding electrode pads;

a first barrier layer formed on at least one of the plurality of electrode pads;

a second barrier layer formed on at least one of the plurality of connection pads; and a plurality of solder bumps provided between the respective corresponding electrode pads and connection pads, and configured to electrically connect the respective corresponding electrode pads and connection pads together, wherein the first and second barrier layers have substantially the same composition of major materials.

2. The semiconductor device of claim 1, wherein
the first barrier layer is formed on the at least one of the plurality of electrode pads other than those which are provided on corner portions of the semiconductor chip.

3. The semiconductor device of claim 2, wherein
the second barrier layer is formed on the at least one of the plurality of connection pads other than those which face the electrode pads provided on the corner portions of the semiconductor chip.

4. The semiconductor device of claim 3, wherein
the first and second barrier layers are both amorphous.

5. The semiconductor device of claim 3, wherein
the first and second barrier layers are both crystalline.

6. The semiconductor device of claim 3, wherein
the first and second barrier layers are each made of a nickel compound formed by electroless plating.

7. The semiconductor device of claim 3, wherein
the first and second barrier layers are each made of a nickel compound formed by electroplating.

8. The semiconductor device of claim 3, wherein
the plurality of solder bumps have substantially the same volume.

9. A method for fabricating a semiconductor device, comprising the steps of:
(a) selectively forming a plurality of electrode pads on an element formation surface of a semiconductor chip on which at least one element is formed;

(b) after (a), forming a first barrier layer containing a metal as a major component on at least one of the plurality of electrode pads by electroless plating;

(c) forming, on a principal surface of an interconnect substrate, connection pads at positions facing the respective corresponding electrode pads of the semiconductor chip;

(d) after (c), forming a second barrier layer containing the metal as a major component on at least one of the plurality of connection pads facing the first barrier layer of the interconnect substrate by electroless plating; and (e) mounting the semiconductor chip onto the principal surface of the interconnect substrate by positioning the semiconductor chip and the interconnect substrate so that the electrode pads of the semiconductor chip face the respective corresponding connection pads of the interconnect substrate with the respective corresponding solder bumps being interposed therebetween, and bonding the semiconductor chip and the interconnect substrate together using the solder bumps.

10. The method of claim 9, wherein
in step (b), the first barrier layer is formed on the at least one of the plurality of electrode pads other than those which are provided on corner portions of the semiconductor chip.

11. The method of claim 10, wherein
the metal contained in the first and second barrier layers contains nickel as a major component.

12. The method of claim 10, wherein
in step (d), the second barrier layer is formed on the at least one of the plurality of connection pads other than those which face the electrode pads provided on corner portions of the semiconductor chip.

13. The method of claim 10, wherein
the plurality of solder bumps have substantially the same volume.

14. The method of claim 10, further comprising the step of:
(f) after step (e), filling a gap between the semiconductor chip and the interconnect substrate with an insulating resin material, and curing the insulating resin material.

* * * * *